United States Patent [19]

Mills

[11] Patent Number: 4,969,469
[45] Date of Patent: Nov. 13, 1990

[54] PARAMAGNETIC DYNAMO ELECTROMOTIVE FORCE DETECTOR AND IMAGING SYSTEM INCORPORATING SAME

[76] Inventor: Randell L. Mills, R.D. 2, Cochranville, Pa. 19330

[21] Appl. No.: 310,517

[22] Filed: Feb. 14, 1989

Related U.S. Application Data

[63] Continuation of Ser. No. 679,884, Dec. 10, 1984, abandoned.

[51] Int. Cl.$^5$ ............................................. A61B 5/05
[52] U.S. Cl. ............................ 128/653 AF; 324/201; 324/204
[58] Field of Search ................... 128/653, 659; 600/9; 324/201, 204, 244

[56] References Cited

U.S. PATENT DOCUMENTS

| | | | |
|---|---|---|---|
| 3,980,076 | 9/1976 | Wikswo, Jr. et al. | 324/201 |
| 4,270,545 | 6/1981 | Rodler | 128/653 |
| 4,366,820 | 1/1983 | Heyda et al. | 128/659 |
| 4,436,684 | 3/1984 | White | 128/653 |

FOREIGN PATENT DOCUMENTS 8103226 11/1981 PCT Int'l Appl. ................. 128/653

OTHER PUBLICATIONS

Brooks et al., "Principles of Computer Assisted Tomography (CAT) in Radiographic and Radioisotopic Imaging", Phy. Med. Biol. 1976, vol. 21, No. 5, pp. 687-732.

Primary Examiner—Ruth S. Smith
Attorney, Agent, or Firm—Hamilton, Brook, Smith & Reynolds

[57] ABSTRACT

An imaging system wherein the subject or patient to be examined is placed in a uniform constant magnetic field which is movable over the patient. A secondary magnetic field is generated by paramagnetic substances within the subject when located within the constant magnetic field. In a human body, the primary paramagnetic substance is deoxygenated blood, whereupon the presence of deoxygenated blood in the constant magnetic field produces the above-mentioned secondary field. The secondary field is detected by a two-dimensional array of magnetic field detectors, in close proximity with the patient, mechanically moved simultaneously with the source of primary magnetic field through a region, whose resulting electrical signals are received and processed by an array processor which operates to provide a reconstructed three-dimensional image. In the preferred embodiment as a medical scanner, the present invention provides three-dimensional imaging of arterial and venous blood throughout the human body.

9 Claims, 5 Drawing Sheets

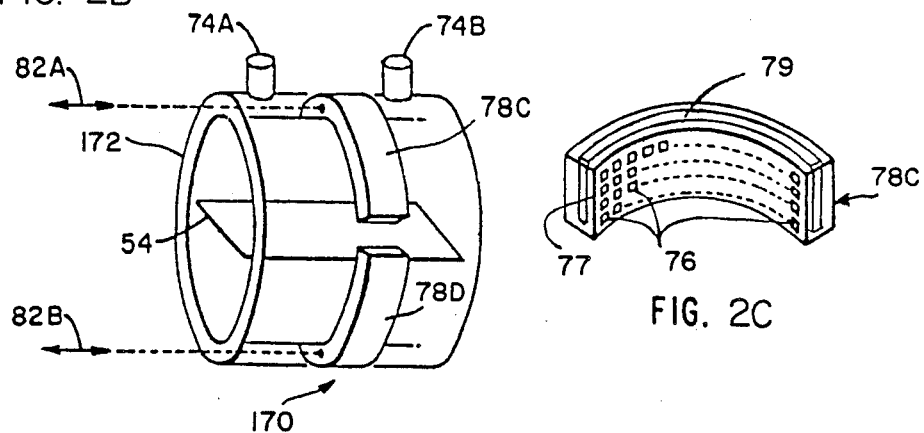
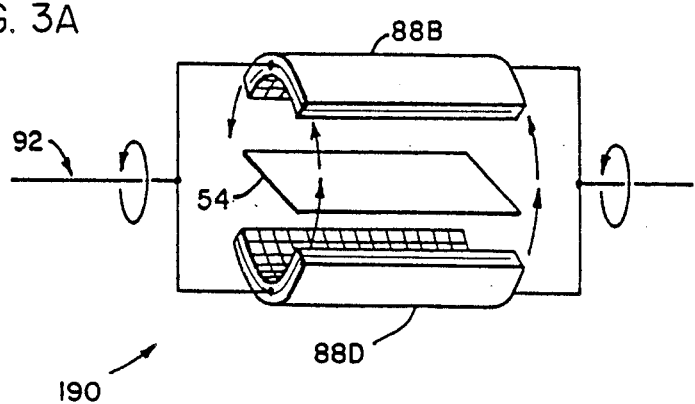
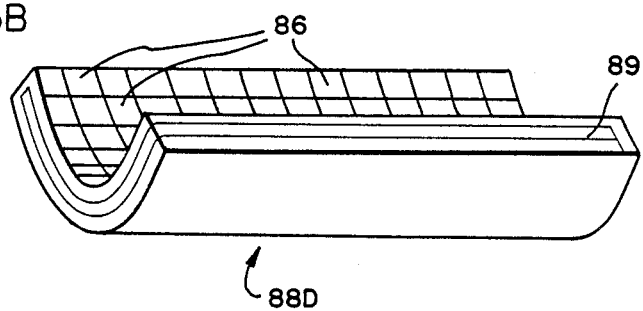

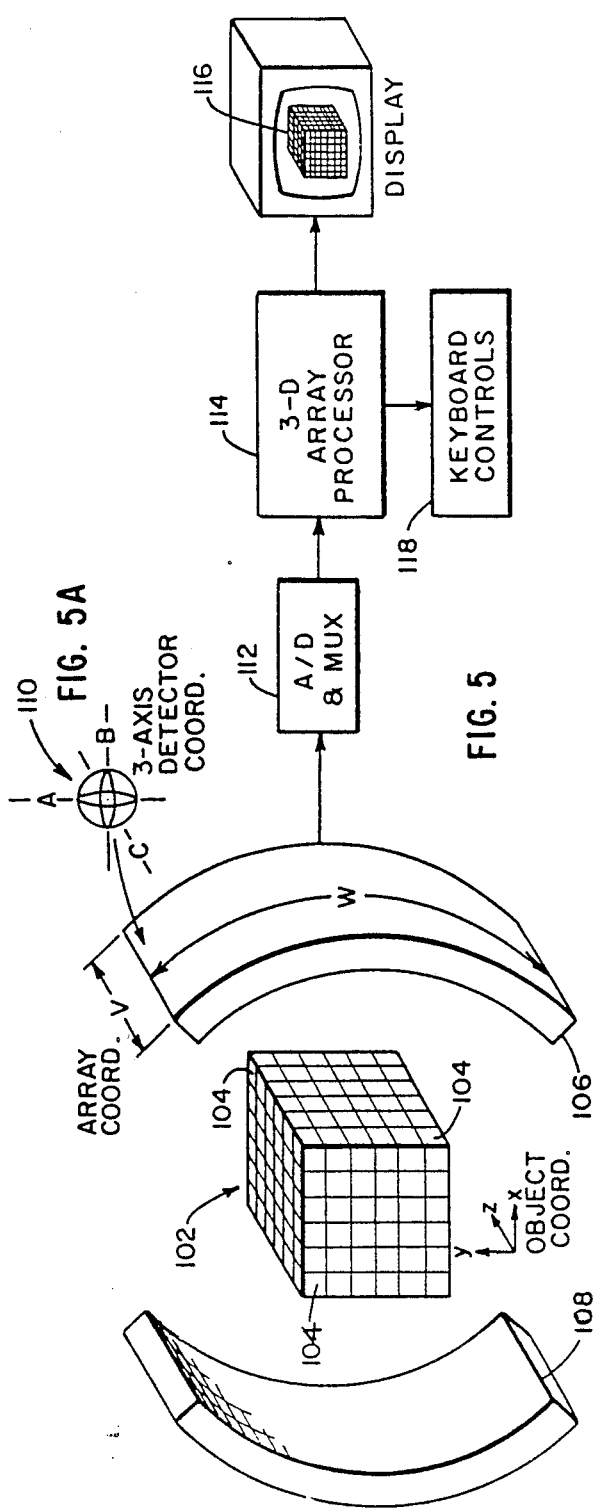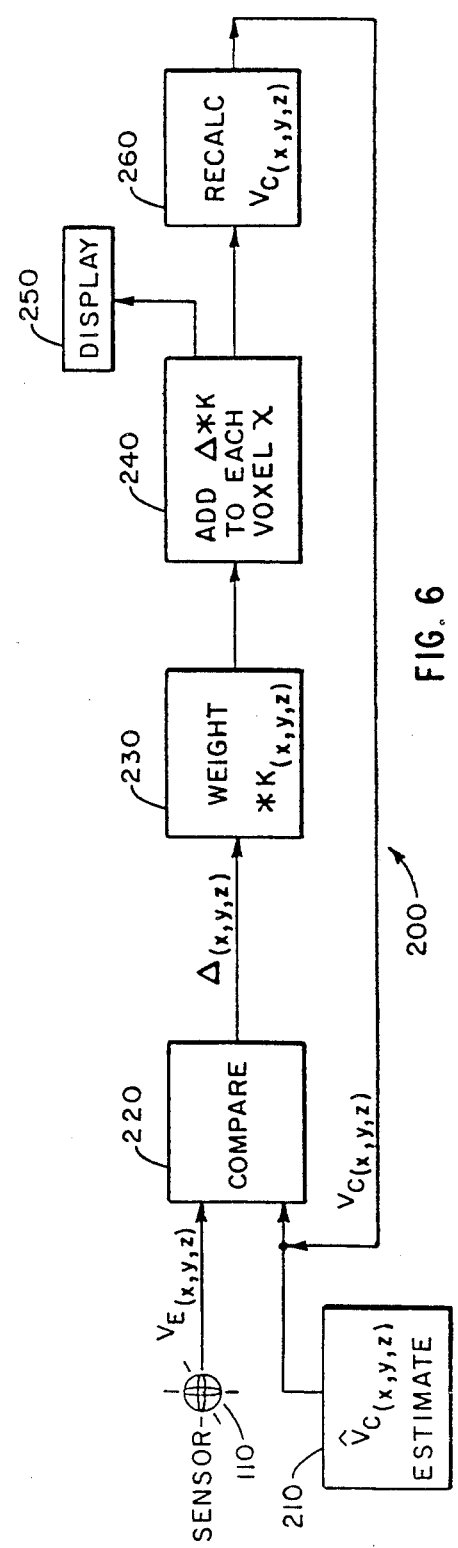

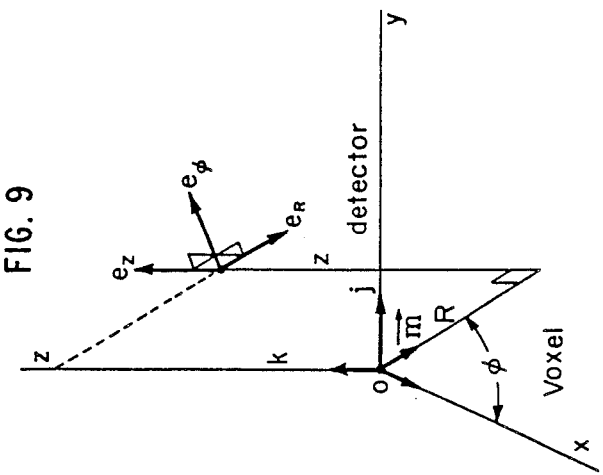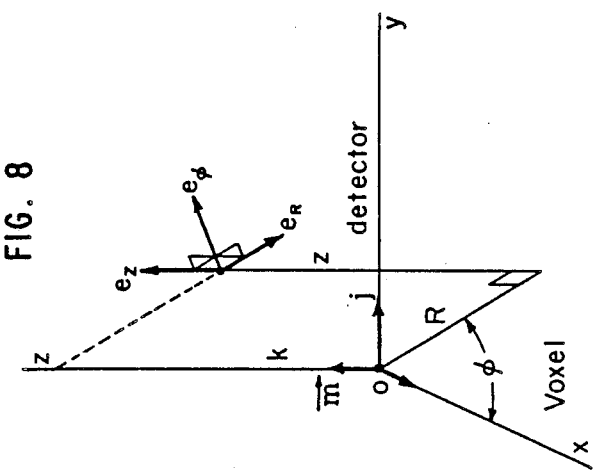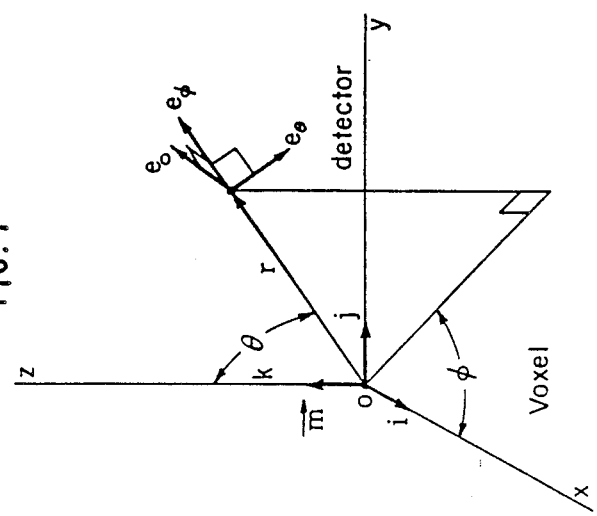

PARAMAGNETIC DYNAMO ELECTROMOTIVE FORCE DETECTOR AND IMAGING SYSTEM INCORPORATING SAME

This application is a continuation of application Ser. No. 06/679,884, filed Dec. 10, 1984, now abandoned.

FIELD OF THE INVENTION

The present invention relates to medical imaging devices, and in particular to medical imaging devices operable according to the paramagnetic susceptibility of tissue and the measurement thereof.

BACKGROUND OF THE INVENTION

Various medial imaging systems and apparatus provide the desired imaging according to phenomenon associated with the tissue. For instance, the absorption of x-rays is exploited for x-ray and computer-aided tomography imaging. The effects on nuclear spin of various molecular elements is used in the nuclear magnetic resonance (NMR) imaging systems. Ultrasonic imaging is provided by exploiting the reflectance and transmissivity of the tissue. All imaging systems have particular limitations and features for their applications. However, one such limitation of imaging systems are that they are generally tissue-selective, whereupon only a few types of tissue features provide a varying phenomenon measurable by the particular imaging system necessary to produce the desired image.

Of particular interest in the practice of oncology is observation of the development of new capillaries at tumor sites. However, many of the available imaging techniques fail to provide the desirable information necessary to provide a useful image. Alternatively, invasive techniques such as injecting an radioactive opaque dye produce an image, but also produce discomfort to the subject and create a degree of risk. It is therefore useful and important to the medical community to provide high-contrast imaging of the circulatory system with minimal patient discomfort and risk.

In addition to NMR imaging, other prior art measurements of body tissue in a magnetic field presume that the body tissue acts a attenuator of the field. However, the attenuation provided by such models only provides one part in $10^{-5}$ attenuation, providing a change in magnetic field which is well into the noise and experimental error of such apparatus. The signal is insufficient to provide the information to create useful results, let alone tissue imaging.

SUMMARY OF THE INVENTION

The paramagnetic dynamo electromotive force detector (PDED) imaging apparatus and method of the present invention provides a three-dimensional image according to the measurement of the magnetic characteristic of certain body tissue, in particular the paramagnetic properties and structure of hemoglobin and related body substances to provide a detailed image of the circulatory system. The subject or patient to be examined is placed in a constant or slowly varying magnetic field. The paramagnetic property of hemoglobin produces a secondary magnetic field which is sensed by a two-dimensional detector array. The detector array produces a plurality of signals corresponding to the sensed magnetic field over the area of the detector array. According to the present invention, a three-dimensional mathematical model of the magnetic susceptance of tissue is developed from which a modelled array signal is calculated. The detector array signals are compared t the modelled array signal, whereupon the resulting differences are used to adjust the model of magnetic susceptibility to provide a corresponding image of the body tissue, and in particular the spatial distribution of arterial and veinous blood.

The basic PDED phenomenon is discussed in the paper, "The Magnetic Properties and Structures of Hemoglobin, Oxyhemoglobin, and Carbonmonoxyhemoglobin," by Linus Pauling and Charles D. Coryell, Gates Chemical Laboratory, California Institute of Technology, *Proceedings of the National Academy of Science*, vol. 22, page 210–216, 1936. The results of subsequent investigations were published in the paper, "Magnetic Studies of Ferrihemoglobin Reactions II Equilibria and Compounds with Azide Ion, Ammonia, and Ethanol," by Charles D. Coryell and Fred Stitte, *Journal of the American Chemical Society*, vol. 62, page 2942–2951, 1940; and in the article; "Magnetic Properties and Structure of Ferrihemoglobin (Methemoglobin) and Some of Its Compounds," by Charles D. Coryell, Fred Stitt, and Linus Pauling, *Journal of the American Chemical Society*, vol. 59, page 633–642, 1937. As discussed in the above-cited articles, the dexoygenated blood media in a magnetic field provides a pronounced paramagnetic contribution. According to the present invention, when the subject is placed in a constant or slowly varying or moving primary exciting field, this contribution or secondary magnetic field is measurable. Moreover, the present invention permits the exciting field contribution to be removed, wherein the secondary magnetic field contribution can be measured with accuracy. The measured signal is combined with signals measured from other positions in a two-dimensional array in relative proximity to the subject, wherein the signals are subsequently combined and processed to provide three-dimensional data.

The PDED apparatus according to the present invention processes the signals produced in three dimensions by the two-dimensional sensor array, whereupon the results are array-processed to recover a three-dimensional image of the particular magnetic susceptibility of the tissue. In particular, the present invention may be embodied in at least six alternatives, each providing a relatively significant level sensor signal contribution from the secondary magnetic field, apart from the contribution by the exciting magnetic field. The signals so generated are received by an array processor, which is operated according to an iterative processing sequence. The processing sequence of the array processor may include one or more of known image reconstruction methods, and such are noted below as appropriate. The resulting apparatus therefore provides detailed three-dimensional imaging of patient tissue, in particular the tissue having significant paramagnetic contribution, being mostly deoxygenated blood.

BRIEF DESCRIPTION OF THE DRAWING

These and other features of the present invention will be better understood by reading the following detailed description, together with the drawing, wherein:

FIG. 2c shows an array of detectors combined with the magnetic field source;

FIG. 2B shows an element of a fifth embodiment of the present invention;

FIG. 3A shows an element of a sixth embodiment of the present invention;

FIG. 3B shows an exemplary detector array combined with a magnetic field source;

FIG. 5 shows the system according to the present invention;

FIG. 5A shows a magnetic sensor having three orthogonal sensing coils;

FIG. 6 shows the general processing steps of the system of FIG. 5 according to the present invention;

FIG. 7 is a graph showing the unit vector in spherical coordinates for reconstruction according to one embodiment of the present invention;

FIGS. 8 and 9 are graphs showing the unit vectors in cylindrical coordinates according to the present invention.

DETAILED DESCRIPTION OF THE INVENTION

General Embodiments

Figure 1:
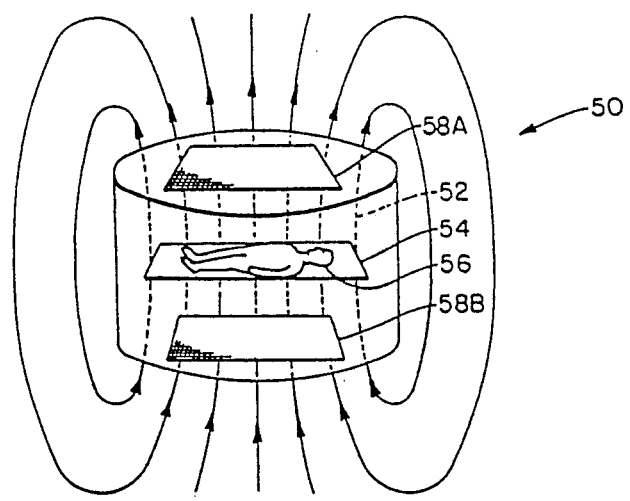
FIG. 1 shows a first embodiment of the present invention.

Two strategies in design of the paramagnetic dynamo electromotive force detector (PDED) are possible, and each having particular advantages. In one strategy 50 shown in FIG. 1, a uniform magnetic field 52 generated by permanent- or electromagnets is located in a region of space 54 which will contain the patient 56. A detector array or arrays 58A, 58B containing multiple coils is then mechanically moved axially through space in that region which adjoins the patient 56, and the signal is first recorded in the absence of the patient. Implicit in all embodiments is that the space does not contain other paramagnetic matter (e.g. $O_2$); imaging the patient in a diamagnetic gas atmosphere will insure this condition. The second signal is recorded by following the previous procedure exactly, but with the patient present, and the second recorded signal is subtracted from the previously recorded signal This differential subtraction method would then subtract noise and moving the coils, versus moving the coils and magnets as discussed below, represents a PDED having simplified mechanics of motion for the detectors.

Figure 2:
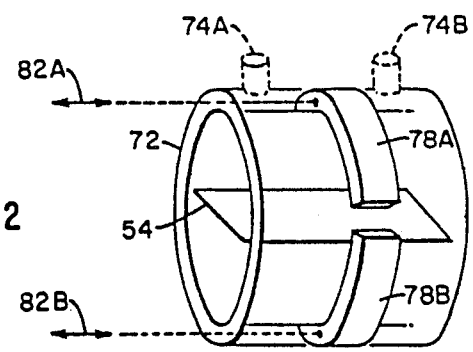
FIG. 2 shows a second embodiment of the present invention.
Figure 2A:
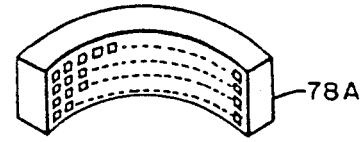
FIG. 2A shows the magnet array of the embodiment of FIG. 2.

A second embodiment 70 of the PDED system according to the present invention is shown now in FIG 2. The space 54 which contains the patient (not shown) is located within a cylindrical enclosure 72 providing a magnetic field therethrough. A curved pair of detector arrays 78A and 78B, shown in FIG. 2A, substantially surrounds the area of the space 54. The detector array 77 shown in FIG. 2 comprises a plurality of current loops operable to provide detection of the magnetic field, generating a current in response thereto. The individual current loops 76 are arranged in regular spacing thereon to provide signals corresponding to a particular area of magnetic field. Detectors 76 are formed in an arcuate fashion, such that the detector array 77 substantially conforms to the circular region about the area of the space 54. The detector arrays 78A and 78B may be uniformly moved through the region surrounding the area of the space 54 by gas or hydraulic pressure supplied or exhausted through ports 74A and 74B. Alternatively, the detector arrays 78 may be moved by mechanical apparatus (now shown) connected thereto by mechanical linkages 82A and 82B.

Figure 3:
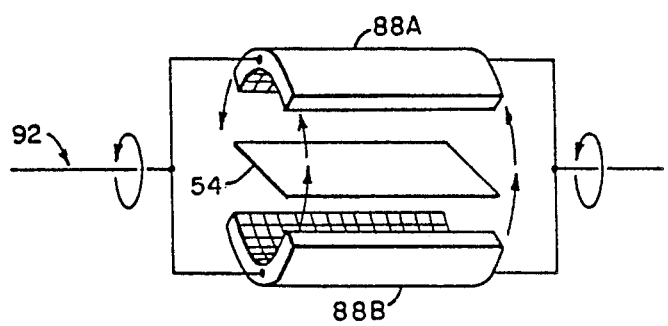
FIG. 3 shows a third embodiment of the present invention.

A further alternate embodiment 90 according to the present invention is shown in FIG. 3. The plane of the space 54 is centered between rotating arrays of sensors 88A and 88B. The arrays are connected by a mechanical structure, not shown in detail, to rotate about an axis 92 coincident with the longitudinal axis of the space 54.

Figure 4:
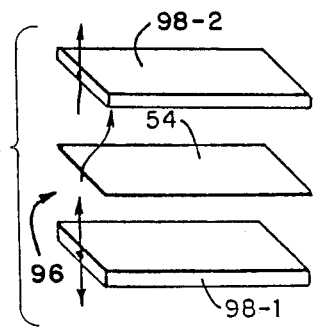
FIG. 4 shows a fourth embodiment of the present invention.
Figure 4A:
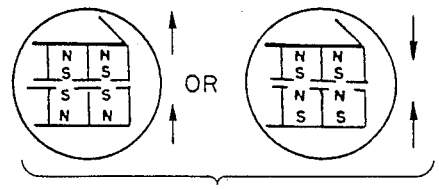
FIG. 4A shows the magnet and sensor combination of FIG. 4.

A fourth alternative implementation 96 according to the present invention as shown in FIG. 4 combines the magnetic sensors and the source of magnetic field within a common element 98-1, 98-2, which is moved as a plane toward the plane of the space 54. Therefore, in this embodiment 96, the magnetic sensors receive no change in flux by virtue of change of the sensors relative to the primary or exciting magnetic field. However, addition contributions due to secondary magnetic field radiation, such as arising from the patient, are detected.

A fifth alternate implementation 170 according to the present invention, shown in FIG. 2B and including FIG. 2C, combines the magnetic sensors, and the source of the magnetic field 79 within a common element 78C. The space 54 which contains the patient (now shown) is located in a cylindrical enclosure 172. A pair of detector-magnets 78A and 78B having the magnetic field source 79 therein therefor alternately labelled 78C and 78D having the magnetic field source 79 therein arranged to form an arcuate segment, shown in FIG. 2C, substantially surrounds the space 54. The detector array 77 shown in FIG. 2B and also FIG. 2A comprises a plurality of current loops operable to provide detection of the magnetic field, generating a current in response thereto. The individual current detector loops 76 are arranged in regular spacing thereon to provide signals corresponding to a particular area of magnetic field. The current detector loop 76 are disposed in an arcuate fashion, such that the detector array 77 substantially conforms to the circular region about the area of the patient. The detector-magnet assembly 78C and 78D may be uniformly moved through the region surrounding the area of the space 54 by gas or hydraulic pressure supplied or exhausted through ports 74A and 74B. Alternately, as shown in FIG. 2B the detector-magnet array 78C and 78D may be moved by mechanical apparatus (not shown) connected thereto by mechanical linkages 82A and 82B.

A sixth alternate embodiment 190 according to the present invention, shown in FIG. 3A, combines the magnetic sensors 86 and source 89 of the magnetic field into a common element 88B, 88D. Exemplary element 88D is shown in greater detail in FIG. 3B. The plane of the patient in space 54 is centered between rotating arrays or magnet-detectors 88B and 88D. The arrays are connected by a mechanical structure, not shown in detail, to rotate about an axis 92 coincident with the longitudinal axis of the space 54.

In all of the embodiments shown, as well as other embodiments according to the present invention, the detectors are primarily responsive to the secondary magnetic field produced by the paramagnetic properties of the material investigated. However, the secondary magnetic field is defined in response to the primary or exciting magnetic field produced by permanent or electromagnetic sources. According to the present invention, the primary magnetic field is assumed to be constant, or at least predictable in variation, wherein the signals produced by the sensing coils may be processed in a manner to remove contributions to the magnetic field directly from the primary or exciting magnetic field. Therefore, according to the present invention, the magnetic field properties and sensor characteristics produced in the region of the patient, exciting magnet, and magnetic sensors should be predictable, repeatable, and preferably constant (or linear for the sensor). If the field produced by the exciting magnet is essentially constant, there will be minimal change in flux received by each magnetic sensor due to variations in the exciting magnet field. However, if the intensity of the primary magnetic field varies significantly, the signals derived from the primary magnetic field must first be isolated by a preliminary pass or system operation, the signals which result being subtracted from subsequent system operation with the patient present. Additional and alternate signal correction can be made by one skilled in the art.

A general system 100 is shown in FIG. 5. Here the object to be investigated 102 is subdivided into a plurality of volume elements 104, hereinafter defined as voxels, as having the coordinate locations X, Y, and Z. Array detectors 106 and 108 are located in close proximity to the object investigated 102 along coordinates V, W, to receive the secondary magnetic field generated therein with minimum attenuation or interference. The source of exciting or primary magnetic field is not shown, but can be provided according to the suggested embodiments of FIGS. 1–4. The detector arrays 106, 108 comprise a plurality of magnetic detectors arranged along the axes W and V, where the total number of magnetic sensors in either array sensor 106 or 108 would be the total of W×V detectors. To maximize the information provided by each detector, the magnetic detector may comprise a three-axis magnetic detector 110 shown in FIG. 5A having axes A, B, and C. Thus, two-dimensional detectors define mutually perpendicular planes; the magnetic detector could comprise additional two-dimensional detector which define planes oriented at predetermined angles relative to any of the three mutually perpendicular planes. Therefore, according to the present invention, each detector array 106 and 108 comprises a plurality of magnetic sensors each having a three-dimensional (3D) sensor arrangement. The resulting signals are received by a signal multiplexer and analog-to-digital converter 112. The resulting digital signals are received by an array processor 114 which is operable to perform array processing of signals in three dimensions according to the process described generally in FIG. 6. The resulting signals are displayed on a video display 116 or other device to accurately convey image information. The array processor 114 receives operator instructions by a keyboard entry 118 to include system operation commands such as initialize, image rotate, cross-sectional plane abstract, and other useful commands such as may be desired. The multiplexer and analog-to-digital converter 112 3D array processor 114, video display 116, and keyboard entry controls 118 are generally known in the art of imaging systems, with the exception of the three-dimensional array processor 114, which may comprises a two-dimensional array processor adapted to process the information serially in two dimensions, thereafter reconstructing the third dimension. However, other implementations such as may be known can be implemented according to the present invention process discussed below.

There are two strategies of producing electrical voltage signals which isolate the PDED phenomenon. A secondary magnetic field radiates from the body as a response to the primary exciting magnetic field that aligns the magnetic moments primarily of the unpaired electrons of deoxyhemoglobin. Voltages are generated in coil detectors from the magnetic field which is radiated from the body as this flux changes as a function of time due to changes in secondary radiated field as a response to a change in the vector location of the primary exciting field flux and/or changes with time in the vector location of the detectors with respect to the secondary radiated field. One strategy to record the PDED signal involves moving only the detectors in a uniform magnetic field; this method is discussed below as the differential subtraction method. The other strategy involves movement of the detectors and the magnets where the former are rigidly attached to the latter. Furthermore, for both strategies there are three principal modes of motion of the device relative to the patient as shown in FIGS. 2–4; (1) revolution of the device about the longitudinal axis of the patient, (2) motion of the device perpendicular to the coronal plane of the patient, and (3) motion parallel with the sagittal plane of the body. In all of these modes, since the primary field in constant, the voltage is due to the time-dependent change of the vector position of the detector relative to the volume elements that gives rise to the secondary magnetic field.

The two strategies in the design to establish a secondary magnetic field, to obtain voltages in response to changing flux from the secondary magnetic field, to accurately record the voltage at a given time together with the vector primary field strength, rate of change of that field and vector location of the detector are the differential subtraction method and the coupled method.

In the former method, a uniform magnetic field is generated by a permanent magnetic or a stable electromagnet(s) in a region of space which will contain the patient. A detector array or arrays containing multiple coils is then mechanically moved through this space in proximity to the patient, and the signal is first recorded in the absence of the patient. Implicit in this procedure is that the space does not contain other paramagnetic or ferromagnetic matter (e.g. $O_2$); a diamagnetic atmosphere will insure this condition. The second signal is recorded following the previous procedure exactly, but with the patient present, and the second recorded signal is subtracted from the previously recorded signal. This differential subtraction method would then subtract noise, and moving coils, versus moving the coils and magnets as discussed below, represents a PDED having simplified mechanics of motion for the detectors.

The other method, or "coupling" method, is to produce the signals in a single scan by using detectors that incorporate both the magnet and detecting coils as one unit. Three principal modes of movement of the detectors relative to the patient, previously discussed, are possible with this method: (1) revolution of the device around the longitudinal axis of the patient, (2) motion perpendicular to the coronal plane of the patient, and (3) motion parallel with the sagittal plane of the body. In all cases, the voltage is due to a time-dependent change in the vector distribution of the primary exciting magnetic field and the vector position of the detector relative to the volume elements that give rise to the secondary magnetic field.

Signal-to-Noise

The next consideration is the signal-to-noise relationship, which can be analyzed according to two possible approaches. First, the limit of resolution due to noise may be maximized by using the smallest possible detector, that is one that has the smallest area. The second method for greatest resolution uses overlap of large detectors and taking of the difference between large signals to solve for small areas. Therefore the problem with this technique is small differences of large numbers. However, there are several possible strategies available for maximizing the signal with this technique. For example, if a large PDED records the signal due to flux change through an area N which is 8/9M, where M is an area of a region of the array, and eight other detectors record the complement 8/9M of N and each other, then the original signal and the other eight signals can be used to divide the area into nine subsets with a value for each. Then if this is repeated k times for each of these nine subsets, the area of each of the final subsets will be $(1/9)^k$ of the original area, M.

Magnet Design

Because the secondary field is generated as electrons align in response to the primary field, the magnetic fixed strength and vector direction of the flux change through any given detector coil due to the secondary field is a function of the magnitude and vector direction of the primary magnetic field and the change of these variables with time. Furthermore, these variables are affected by the geometry and material design of the magnet in the case of a permanent magnet and the geometry, electric current, and material design in the case of an electromagnet. The effect of magnet geometry on the primary magnetic field is shown typically in U.S. Pat. No. 4,240,439.

The flux from given aligned electrons of a volume of magnetizable blood is maximized if the electrons are aligned so that, a when a mode of motion is implemented, the change in flux is perpendicular to the plane of the coil. Moreover, the flux intensity at any detector decreases as a function of the distance from the detector to the magnetizable blood, giving rise to the signal. However, the voltage generated at any given detector is due to the perpendicular projection of the total change in flux through the detector coil and the flux is due to specific paramagnetic characteristics in the entire body. The variables of magnet design which maximize a signal due to any given volume element may not maximize the signal from another volume element. And the voltage generated at any given detector may be less than is possible with other primary field parameters. Also, those parameters which maximize the signal at any given detector may cause a less than maximum signal at any other detector; therefore, a magnet must be designed which will maximize the total signal from the secondary field for all detectors from all of the magnetizable blood in the body.

Resolution

For either the differential subtraction method or the coupling method, increasing the number of detectors from which a different voltage can be recorded due to different spatial orientations will improve resolution, and increasing the number of distinguishable signals recorded by any given detector in a given period of time will enhance the resolution.

Furthermore, by recording at any given sampling frequency for an increased period of time, more signals are obtained however; vascular system excursions occur with time and the image resolution deterioration by this effect. Therefore the signal recording time period which maximizes resolution is implemented. Moreover, groups of signals could be obtained at different times in the cardiac cycle, for example, and these can be time-averaged to increase the signal-to-noise ratio. This is well known to those skilled in the art as gating, and appears in U.S. Pat No. 4,182,311.

Furthermore, since the relaxation time, or time to respond to a change in vector magnetic field strength, for an electron is of the order of $10^{-11}$ seconds, the blood becomes magnetized essentially instantaneously, in accordance to the equations discussed below. Thus, the change in secondary magnetic field and change in primary magnetic field are in phase with each other; therefore, in the case of the coupling method, the device can be moved very rapidly relative to the body and a high sampling can be implemented to improve resolution.

Also, increasing the number of windings per coil of the detector increases the voltage detected by the detector for any given change in flux, and this improves resolution.

In the case of the coupling method involving the rotation about the longitudinal axis of the patient, the earth's magnetic field would have to be eliminated by an opposing permanent magnet or electromagnet. Also, removal of inhomogeneities in external fields in the cases of the other modes of movement will improve resolution.

Reconstruction

If as many voltages are obtained as there are unknowns, the PDED output voltages can be used to reconstruct the positions of blood vessels. For example, if N unknowns are to be determined, then the product of the number of PDED signals obtained as a function of time and motion of the device at each detector times the sum of all the detectors must equal the number of unknowns.

A typical linear velocity for a PEDE is 2000 cm/sec; a typical field strength is 0.2 T; a typical area for the detector of 500 turns is 1 mm$^2$; a typical signal is 100 $\mu$v; and a typical detection frequency is $10^6$ Hz. If signals were recorded at every $10^{-6}$ seconds for $5 \times 10^{-2}$ seconds, then $5 \times 10^4$ points could be obtained for each detector.

Several applicable imaging techniques are described in "Principles of Computer Assisted Tomography (CAT) in Radiographic and Radioisotopic Imaging," by R. A. Brooks and G. DiChiro, *Phys. Med. Biol.*, vol. 21, No. 5, (1976), p. 689-732. The imaging techniques described therein apply to a cumulative effect, such as x-ray attenuation over a ray having narrow section width and height, which penetrates the patient. The present invention may apply the referenced techniques by realizing that the measured secondary field is a summation of the individual secondary magnetic field contribution for the volume (subsections) of the patient, which if calculated in one plane (2D) is a summation of the individual subsection secondary field contribution, each having a related $1r^n$ attenuation where n is a rational number as appears in the calculations that follow. The sensors of the present PDED imaging system receive secondary magnetic field contribution in 3D, so that each sensor receives a total measured field which includes contributions from all portions of the patient producing a secondary magnetic field. The signal at each detector is determined by the variables exemplified in the reconstruction equations; since the signal at each detector is independent of the signal at any other detector. The system of independent detector signal equations can be solved for the magnetic susceptibility function of the body. The solution may first be carried out in two dimensions. The reference reconstruction techniques may be additionally reiterated over the third dimension to provide a determination of the secondary field contribution of the individual voxels. Having determined the contribution of the voxels, the determination of the corresponding magnetic susceptibility, and therefore the generation of an image can follow.

For all methods, the space that the body occupies is divided into unit Voxels, or elements of volume $V_T/n$, where $V_T$ is the total volume of the space reconstructed and n is the total number of units. The equations for the projection of the magnetic moment of the Voxel that gives rise to a signal in each detector for a given unit is set up. This is repeated for all units, and the signal at any given detector is equal to the sum of the contributions from all units which can produce a signal at that given detector. This sum is determined for all detectors. For those units which contain the diamagnetic gas, the contribution is set equal to zero. Then a guess is made as to the magnetic susceptibility X for each volume unit and the signals are calculated using these values and compared to the scanned value and a correction is made to X of each unit which gives rise to a second, or recomputed X estimate for each unit. The signal value from this second estimate is computed and corrections are made as previously described. This is repeated until the correction for each reiteration approaches a predefined limit which serves to indicate that the reconstruction is within reasonable limits of error.

The general process of reconstruction according to the present invention is shown according to the steps of FIGS. 6. The image displayed according to the process 200 is directly related to the magnetic susceptibility X of voxel sections 104 of the object 102 examined, the image is merely a mapping of the magnetic susceptibility in three dimensions. Accordingly, signals produced by the magnetic sensors 110, in terms of volts, are a direct result of the magnetic susceptibility X of the voxel elements 104. Therefore, according to the present invention, a reference voltage is generated at 210 from which the actual or measured sensor voltages is subtracted at 220. The reference voltages are modelled by assuming a signal contribution from each voxel element to each sensor. Therefore, the signals are summed separately for each sensor according to a weighted contribution of the voxel elements over the x, y, and z axes according to a model of the tissue to be examined. The resulting modelled or calculated voltage signals are compared at step 220, providing a difference or $\Delta$signal, weighted at step 230 to produce a weighted difference signal, which is then added to the previously estimated susceptibility value for each voxel element at step 240. The resulting level, available in three dimensions corresponding to the axes x, y, and z, is selectively displayed on the display 116 at step 250. Having adjusted the estimated susceptibility for each voxel, the calculated magnetic susceptibility is recalculated at step 260, the resulting estimated sensor voltage is then compared to the actual sensor voltage at step 220, the process 200 being repeated until the difference is reduced to a tolerable value. The particular reconstruction algorithms or processes may include the processes described in previous patents.

The digitization of sensor signals and display generation is shown typically in U.S. Pat. Nos. 4,197,583 and 4,203,035, and in U.S. Pat. No. 4,292,977, which describes a system for three-dimensional image display. A typical structure for processing stored image data is shown in U.S. Pat. Nos. 4,272,820 and 3,778,614, which a though only process data in two dimensions, can be further restructured to accommodate a three-dimensional imaging process. According to the present invention, the signal processing by these and other processes and apparatus are incorporated by reference, and may be implemented in present by one skilled in the art.

If, for example, the detecting device is 6 ft$\times$2 ft and each PDED is 1 mm$^2$, then it would contain $1.2 \times 10^6$ PDEDs, and for x, y, and z this would result in $3.6 \times 10^6$ PDEDs; for a device on each side of the patient, $7.2 \times 10^6$ PDEDs results, and for $5 \times 10^4$ signals recorded by each detector, this amounts to $3.6 \times 10^{11}$ independent voltages per scan. If the patient weighs 70 kg, then his/her volume is approximately $7 \times 10^7$ mm$^3$. Therefore, such device would produce $5 \times 10^3$ pieces of data for each cubic millimeter, and, therefore, it would provide high resolution image data.

It may also be important to combine smaller areas into larger areas to enhance the signal or reduce the time of processing the signal. For example, for the regions containing no body part the magnetic susceptibility can be set equal to the relative zero value. And, the region over the heart may be treated with larger areas in the smallest reconstruction on it, whereas the area of the renal arteries may be reconstructed using higher resolution.

In addition, the body can be divided up into $3.6 \times 10^{11}$ units, and the $3.6 \times 10^{11}$ voltages equations can be solved for the susceptibility value in each unit. Since this matrix is too large to invert an iterative algorithm which calculates the voltage predicted at each detector from previous determinations of the magnetic susceptibility of the body's volume elements and compares the calculated with the recorded value and corrects each body element which contributes to the signal can be implemented to reconstruct the magnetic susceptibility function of the body. An iterative reconstruction calculation can be performed until it stabilizes and the solution is within tolerable limits. Specific detailed discussions of system aspects follow.

Derivation of Paramagnetic Susceptibility Equations

All electrons possess the properties of spin and charge which confers on the electron a magnetic moment $\mu$ which is proportional to the magnitude of the spin, that is $$\mu = -\nu \hbar S = -g\mu_B S$$

$\nu$ is called the magnetogyric ratio of the electron and is measured in radians$\times$sec$^{-1}\times$g$\mu$ass$^{-1}$; hS is the spin angular momentum vector of the electron measured in erg$\times$sec.

Alternately as demonstrated in Equation 1, the magnetic moment may be expressed in terms of a dimension less constant g called the electron g factor, and the electronic Bohr magneton, $\mu_B$. $\mu_B$ is equal to $\bar{e}h/2mc$, where e and m are, respectively, the charge and mass of the electron and c is the velocity of light.

In the presence of an external magnetic field, quantum theory demands that allowable electron spin states are quantized; the component $M_s$ of the electron spin vector in any given direction can take on one of a discrete set of values which are $+S$, $(S-1)$, ... $-S$. $m_s$ is called the electron spin quantum number. For the singe unpaired electron with $s=\frac{1}{2}$, $m_s$ may only take the values $+\frac{1}{2}$ or $-\frac{1}{2}$. Furthermore, the classical energy of a magnetic dipole moment, $\mu$ in a magnetic field H is $\mu \cdot \bar{H}$, or $-\mu_H H$, where $\mu_H$ is the component of the dipole along the field. The electron spin moment can have only two components, $\mu_H = \mu_B$ and $-\mu_B$, where $\mu_B$ is the Bohr magneton. Those correspond to two allowed values of the electron spin quantum number $m_s = \frac{1}{2}$ and $m_s = \frac{1}{2}$. Thus, there are two spin states corresponding to energies $\mu_B H$ and $-\mu_B H$ with energy difference $2\mu_B H$. More precisely, this energy difference is $g_s\mu_B H$, where $g=2.0023$ for the completely free electron spin moment. With the Bohr rule, $$e_{m\frac{1}{2}} - E_{m=-\frac{1}{2}} = g\mu_B H$$

The lower energy level with $m_s = -\frac{1}{2}$ corresponds to the situation in which the magnetic field, H, and the electron moment are parallel; in the higher energy level, they are antiparallel.

To establish the paramagnetic susceptibility relationship by a quantum-mechanical calculation, the Hamiltonian operator must first be determined. This can be done by first separating H into two parts:

$$H = H_o + H'(H)_1 \tag{3}$$

where $H_o$ is the Hamiltonian in the absence of the applied magnetic field, and $H'(H)$ is the part with an explicit field dependence. Since the energies that arise from the field dependence are small, quantum mechanical perturbation theory can be used to solve for the result of the addition of $H'(H)$ to $H_o$ in Equation 3.

For a paramagnetic substance the major contribution to $H'(H)$ is the direct interaction of the molecular moment and the field. As discussed previously, $$\text{Energy} = -\mu \cdot H \tag{4}$$

The moment due orbitial angular momentum of the electron is given by $$\mu = -\mu_B L \tag{5}$$

and the moment due to the spin angular momentum of the electron is given by $$\mu = -g\mu_B S \tag{6}$$

The quantum-mechanical Hamiltonian for parapmagnetism converts Equation 4 into operator form:

$$H'(\text{para}) = -\mu \cdot H = \mu_B H \epsilon_i [L_z(i) + g_o S_Z(i)] \tag{7}$$

where it is assumed that H is entirely along the Z axis and that the electronic orbital and spin moments can be summed over all the electrons in the molecule. The resultant energies can be expressed as a power series in the field, and for the ith energy level, the general form is $$\epsilon_i = \epsilon_i^0 + \epsilon_i^1 + \epsilon_i^{(1)}H + \epsilon_i^{(2)}H^2 + \ldots \tag{8}$$

where $\epsilon_i^0$, $\epsilon_i^{(1)}$, $\epsilon_i^{(2)}$, etc., are constants independent of the field. The magnetic moment in the direction of the field is given by $$\mu_Z = \delta H / -\delta \epsilon \tag{9}$$

and $$\mu_{Zi} = -\epsilon_i^{(1)} - 2\epsilon_i^{(2)}H \tag{10}$$

where higher terms in Equation 8 are neglected. Furthermore, for ordinary fields a net magnetic moment will be induced in a bulk sample, and this induced moment is directly proportional to the applied field, $$M = \chi H \tag{11}$$

where the net induced magnetic moment per unit mass is given the symbol M, and $\chi$ is the mass magnetic susceptibility.

The susceptibility per mole of material is given the symbol $\cap_m$, and the induced moment m is a vector. H is also a vector, and is often called the magnetization vector. $\chi_m$ can be expressed in terms of the number of molecules $N_i$ with moments $\mu_{Zi}$. For 1 mole, $$\chi_m = H/m_z = /1H \, \epsilon_i N_{z}i \tag{12}$$

and, from Equation 10, $$\chi_m = -\frac{-1}{H} \frac{\epsilon}{i} N_i [\epsilon_i^{(1)} + 2\epsilon_i^{(2)}H] \tag{13}$$

Boltzman equilbrium determines the number of molecules in each energy level, $$\frac{N_i}{N} = \frac{e^{-\epsilon_i/KT}}{\epsilon_i e^{-\epsilon_i/KT}} \tag{14}$$

The terms $\epsilon_i^{(1)}H$ and $\epsilon_i^{(2)}H^2$ are much smaller than KT at most temperatures; so, the exponent can be expanded as $$e^{-\epsilon_i/KT} = e^{-\epsilon_o/KT}(1 - \epsilon_i^{(1)}H/KT) \tag{15}$$

The terms in $\chi_m$ that are independent of the applied field are $$\chi_m = \frac{N\epsilon_i[\epsilon_i^{(1)}]^2 \, e^{-\epsilon_{io}/KT}}{KT\epsilon_i e^{-\epsilon_{io}/KT}} - \frac{2N\epsilon\epsilon_i^{(2)}e^{-\epsilon_{io}/KT}}{\epsilon_i e^{-\epsilon_{io}/KT}} \tag{16}$$

where the zero field is equal to zero; therefore $$\epsilon_i \epsilon_i^{(1)} e^{-\epsilon_{oi}/KT} = 0 \tag{17}$$

Since the terms $\epsilon_i^{(1)}H$ and $\epsilon_i^{(2)}H^2$ in Equation 10 are usually small compared to $\epsilon^o_i$, they can be calculated by quantum-mechanical perturbation theory. The term $\epsilon_i^{(1)}H$ is the first order perturbation of the field on $\epsilon^o_i$, and it can be calculated from knowledge of the unperturbed wave functions $\psi^o_i$. From perturbation theory $\epsilon_1^{(1)}$ can be expressed by means of matrix elements of Equation 7.

$$\epsilon_i^{(1)} = \mu_B < \psi^o i | Lz + g_o Sz | \psi^o_i > \tag{18}$$

where the operators Lz and Sz must be summed over all the electrons. If we assume that all the energy levels spacings are much greater than KT except for the magnetic sublevels which are characteristic of quantum mechanical angular momentum, then Equation 18 can be used to greatly simplify the first term of Equation 16. The product $-\mu_B(L_z+g_oS_z)$ is equal to the Z component of the magnetic moment, $\mu_z$. Also, there is quantum-mechanical "sum rule" that applies to the magnetic sublevels characteristic of angular momentum. As a result, if we need only sum the first term in Equation 16 over the magnetic sublevels of the ground state, one gets $$\chi_m = \frac{N\epsilon_i[\epsilon_i^{(1)}]^2}{KT_i e^{-i0/KT}} = \frac{N<\mu_z^2>}{KT} \qquad (19)$$

where $<\mu_z^2>$ represents the value of $\mu_z^2$ averaged over the ground state where $\epsilon_{0i}<<KT$. From vector alegbra, $$<\mu^2_z> = <\mu^2_x> = <\mu^2_y> = \tfrac{1}{3}<\mu^2>$$

therefore, $$\chi_m = \frac{N<\mu^2>}{3KT} \qquad (20)$$

In general, the susceptibility of N molecules, ions, or atoms with spin S is given by the equation $$\chi = \frac{N\mu_B^2 4S(S+1)}{3KT} \qquad (21)$$

According to Curie's law, the paramagnetic susceptibility is represented by $$\chi = \frac{N\mu^2}{3KT} \qquad (22)$$

where n is the number of magnetic ions in the quality of the sample for which X is defined, $\mu$ is the magnetic moment of the ion, and K is the Boltzman constant. $\mu$ can be expressed in terms of Bohr magneton.

$$\mu_B = \frac{e\hbar}{2mc} = .9273 \times 10^{-20} \, erg \cdot G^{-1} \qquad (23)$$

which is the natural unit of magnetic moment due to electrons in atomic systems. Thus one defines the Bohr magneton number n by $\mu=n\mu_B$. Also, the effective moment $\mu_{eff}$ is defined as the reduced magnetic moment (i.e., $\mu_{eff}=\mu/\mu_B$).

Assuming that the magnetic moment comes solely from spins of electrons, and that the spins of electrons are aligned parallel in each ion, the result is $$n=(f(f+2))^{\frac{1}{2}} \qquad (23)$$

Substituting the resultant spin quantum number $S=f/2$, where $S=m_s$ is equal to the sum of the spin quantum numbers of the individual electrons, the result is $$n=2(S(S+1))^{1/8} \qquad (25)$$

Thus, the relationship between the magnetic moment $\mu_{eff}$, and the spin only value is $$\mu_{eff} = \sqrt{4S(S+1)} \qquad (26)$$

where s is the effective spin ($S=\tfrac{1}{2}$ for one unpaired electron in $Fe^{2+}$). Furthermore, the magnetic moment in Bohr magnetons can be calculated from the paramagnetic susceptibility $\chi$ molal by use of the equation $$\mu_{eff} = 2.8 \sqrt{molal(T+\theta)} \qquad (27)$$

where T is the absolute temperature, and $\theta$ is the Curie-Weiss constant.

Calculation of Signal for Paramagnetic Dynamo Electromotive Force Detector

The molecular orbital electronic configuration of $O_2$ is $(1\theta_g)^2(1\theta^*\mu)^2(2\theta_g)^2(1\pi_{px})^2(1M^*_{py})^2(1\pi^*_{px})^1(1\pi^*_{py})^1$ and by Hund's rule, $\int(1\pi^*_{px})=\int(1\pi^*_{py})$; that is unpaired electrons of degenerate orbitals have the same spin quantum number and $O_2$ is therefore paramagnetic.

Figure 10A:
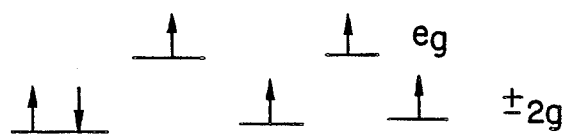
FIGS. 10A and 10B show the electron states of ferrohemoglobin and oxyhemoglobin, respectively.

The magnetic susceptibility of $O_2$ at STP is $1.8\times10^{-6}$. Also, ferrohemoglobin contains $Fe^{2+}$ which is high spin $d^6$ complex, as shown in FIG. 10A, and contains 4 unpaired electrons. However, experimentally oxyhemoglobin is diamagnetic. Binding of $O_2$ to hemoglobin causes profound change in electronic structure such that the unpaired electrons of the free state pair upon binding. This phenomenon is not seen in all compounds which bind hemoglobin. Nitrous oxide is paramagnetic in both the bound and free state and NO-Hb has a magnetic moment of 1.7 Bohr magnetons.

Figure 10B:
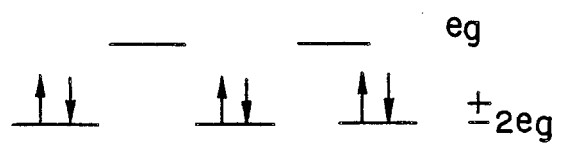

Furthermore, oxyhemoglobin is in a low spin state, containing no unpaired electrons, as shown in FIG. 10B, and is therefore diamagnetic. However, the magnetic susceptibility of hemoglobin itself (ferrohemoglobin) corresponds to an effective magnetic moment of 5.46 Bohr magnetons per heme, calculated for independent hemes. The theoretical relationship between the magnetic moment $\mu_{eff}$ and the $\epsilon$ spin quantum numbers of the electrons is given by $$\mu_{eff} = \sqrt{4S(S+1)}$$

The magnetic moment follows from the experimental paramagnetic susceptibility $\chi$ according to $$\mu_{eff} = 2.84\sqrt{(T+\theta)}$$

where T is the absolute temperature and $\theta$ is the Curie-Weiss constant (assumed to be zero in this case). The experimental paramagnetic susceptibility of hemoglobin/heme globin/heme is $1.2403\times10^{-2}$ (molar paramagnetic susceptibility calculated per gram atom of heme iron.)[2] The concentration of Hb in blood is 150 g/l=$2.2\times10^{-3}$ m; $8.82\times10^{-3}$ m Fe.

Magnetic flus changing through a current loop as a function of time gives rise to an electromotive force which can be measured as a voltage. The pertinent equation is $$\oint E \cdot ds = \frac{d}{dt} \int B \cdot dA$$

Consider a source of the flux consisting of one voxel containing deoxyhemoglobin, and the voxel is of area, 1 cm$^2$, and height, 1 cm. Also, the area of the detector-coil is 1 cm$^2$, and the differential subtraction method is implemented. The voltage in the detector due to deoxyhemoglobin is a function of r, the distance from the detector to the voxel, which is a function of time. The equation for the signal measured at the detector is $$v/\text{loop} = a\, a'2(4\pi f\chi H)(10^{-8})\left[\frac{1}{r^3} - \frac{1}{(r+b)^3}\right]\frac{dr}{dt}$$

where r is the distance from the voxel to the detector, $\chi$ is the paramagnetic susceptibility, H is the applied magnetic field strength, f is the formality of Fe$^{2+}$, a is the area of the detector, a' is the area of the voxel, b is the height of the voxel. If the signal is recorded when the instantaneous velocity of the detector relative to the voxel is 2000 cm/sec, the magnetic field strength is 0.2 T at the voxel, the areas a,a' are both 1 cm$^2$, b is 1 cm, and the instantaneous distance from the detector to the voxel is 5 cm, and the voltage per loop is as follows:

$$v/\text{loop} = (10^{-8})(2)(4)(\pi)\,(8.82 \times$$

$$10^{-3})(1.2 \times 10^{-2})(2000)\frac{1}{5^3} - \frac{1}{6^3}\,2000$$

$$v/\text{loop} = 3.6 \times 10^{-7}\ \text{volts}$$

Therefore a detector of 500 loops records a voltage of 180 μv, and if the blood were 50% saturated with O$_2$, the signal would be 90 μv. Therefore, it can be seen that placing the patient transiently on a respiratory mixture of N$_2$/O$_2$ will allow an appreciable voltage to be detected from the arterial circulation; the veinous system is detected directly as is the respiratory system via the signal from O$_2$. Thus imaging by this modality is specific for the cardiopulmonary and vascular systems.

Calculation of Noise in PDED Imaging

The specific susceptibility of H$_2$O saturated with air and deoxyhemoglobin is $-0.719 \times 10^{-6}$ and $1.2403 \times 10^{-2}$, respectively.

By Curie's law, the paramagnetic susceptibility is represented by $$\chi = \frac{N u^2}{3KT}$$

when N is the number of magnetic ions in the quantity of the sample for which $\chi$ is defined, u is the magnetic moment of the ion, and K is the Boltzman constant. u can be expressed in Bohr magnetons:

$$u_B = \frac{eh}{2mc} = .9273 \times 10^{-20}\ \text{erg/G}$$

which is the natural unit of magnetic moment due to electrons in atomic systems. Thus, the Bohr magnetons number n is given by n=nu$_\beta$.

Assuming the magnetic moments come solely from spins of electrons, and that spins of f electrons are aligned parallel in each magnetic ion, then n=(f(f+2))$^{\frac{1}{2}}$, and substituting the resultant spin quantum number S=f/2 n=2(S(S+1))$^{\frac{1}{2}}$. The free radical concentrations in human liver tissues measured with the surviving tissue technique by Ternberg and Commoner is $3\times10^{15}$/g wet weight. Furthermore, human liver would contain the greatest concentration of radicals, since the liver is the most metabolically active organ.

The molal paramagnetic susceptibility for liver is calculated from Curie's law:

$$\chi\text{mol} =$$

$$\frac{Nu^2}{3KT} = \frac{(3 \times 10^{15}\ \text{electrons})}{g\ \text{tissue}} \frac{(1\ g)}{1\ ml} \frac{(1000\ ml)}{1\ l} \frac{u^2}{3KT}$$

$$\chi = \frac{(3 \times 10^{18})\left[\frac{(.9273 \times 10^{-20}\ erg)}{G}((2)(\frac{1}{2}(\frac{1}{2}+7))^{\frac{1}{2}})\right]^2}{(3)(1.38 \times 10^{-16}\ erg/degk)(310°\ K.)}$$

$$\chi\text{mol} = +6 \times 10^{-9}$$

For any material in which the magnetization M is proportional to the applied field, H, the relationship for the field strength B is B=(1+4$\pi\chi_m$)H$_1$, where $\chi$ is the magnetic susceptibility, m is the molality, and H is the applied field strength. The susceptibility of muscle, bone, and tissue and the diamagnetic atmosphere is approximately that of water, $-7\times10^{-7}<1$; therefore, the attenuation effects of the body on the applied magnetic field are negligible, as are the attenuation effects of the diamagnetic gas atmosphere. Similarly, since the same relationship applies to the secondary irradiated field from deoxyhemoglobin, the attenuation effects on this field are negligible. Furthermore, for liver $$4\pi\chi_m = +7.5 \times 10^{-8} < 1$$

Therefore the effect of the background radicals and cytochromes on the applied field are negligible, and the signal-to-noise ratio is not diminished by these effects. Also, any field arising from the background unpaired electrons aligning with the applied field would be negligible compared to that arising from blood, because the magnetic susceptibility is seven orders of magnitude greater for blood.

Reconstruction Equations

The space is divided into voxels, each of volume V$_T$/n, where V$_T$ is the total volume to be reconstructed. The magnetic moment of an infinitessimal volume is the product of the paramagnetic susceptibility of the matter occuping the infinitesimal volume, the applied magnetic field strength at that point, the infinitesimal area of the volume element, and the infinitesimal height of the volume element. The vector orientation of the magnetic moment is aligned with the vector of the applied field. The components of the magnetic field, B, due to this magnetic moment are determined by finding the components of curl A, where A is the vector potential. The derivation of the components of the field, B, due to a magnetic moment, appears in *Electricity and Magnetism*, Edward Purcell, McGraw-Hill Book Co., 1963, p. 361-367. The derivation is for a magnetic moment at the origin, with the dipole moment vector pointed in the positive Z direction. The field, B, for any other direction of the dipole moment vector can be found by rotating the vector potential relative to any or all of the x, y, or z axes. The rotation operation is performed by multiplying by the appropriate matrix. Furthermore, the components are relative to the x,y,z coordinate system, and the components relative to any other coordinate system can be found performing the appropriate coordinate transformation by multiplying the components by the appropriate transformation matrix.

The B field perpendicular to the plane of the coil through the area of the coil due to the magnetic moment of the entire voxel is found by integrating the component of the B field due to the intintessimal volume element over the area of the voxel and over the distance from the voxel to coil to this distance plus the height of the voxel. The total flux perpendicular to the loop, through the area of the loop due to the magnetic moment of the voxel is the integral of the perpendicular component of the B field over the area of the loop. If the B field due to the magnetic moment is considered constant over the area of the loop, then the result is A times the remaining integral, that is $$\phi = \rho \int \int \int P[\chi \vec{H} \, dxdy \, dh] \, dA = A \int \rho P[\chi \vec{H} \, dxdy \, dh]$$

The flux is equal to the area, A, of the loop, times, the triple integral which is the component of the B field due to the magnetic moment, where P is the magnetic field component operator, $\chi$ is the paramagnetic susceptibility, $\vec{H}$ is the applied field, dxdy is the infinitesimal area element, and dh represents the infinitesimal height element. If $\chi$ and $\vec{H}$ and the B field components due to the magnetic moment were considered constant over the area of the voxel, then this integral reduces to $$\phi = A \int P[a\chi H \, dh]$$

where a is the area of the voxel. If $\chi$ and $\vec{H}$ and the B field due to the magnetic moment were considered constant over the height of the voxel, then this integral reduces to $\phi = A \, P[aB\chi\vec{H}]$, where B is the height of the voxel. Thus, the total magnetic moment is calculated and the above equation is the flux from the distant field of a single dipole of that strength, where the field due to the dipole is considered constant across the area of the detector. The voltage per loop due to the change in this flux with time is given by $$V/\text{loop} = \oint E \cdot ds = \frac{d}{dt} \int B \cdot dA = \frac{d}{dt} \phi$$

That is, the voltage is given by the time derivative of the flux from the voxel. The results from the embodiments follow. Implicit in these reconstruction equations is that the voltage is calculated for the vector magnet moment as shown in the Figures, where the vector magnetic moment aligns with the vector applied field which must be taken into account for every voxel. Also, for any given voxel, different vector applied fields will yield different results. Therefore, these reconstruction equations are not to be considered exclusive.

Furthermore, data is being taken as a function of predetermined times where all of the parameters of the reconstruction equations are known except the paramagnetic susceptibility values. These equations for the voltage at a detector due to the voxels reduce to a sum of magnetic susceptibility values each multiplied by the appropriate coefficient. The magnetic susceptibility values are then determined from these equations by a reiterative algorithm.

In addition, the coefficients of the magnetic susceptibility values in the voltage equations can be determined by experimentally calibrating the imaging device. That is, voltage signals due to standards of known magnetic susceptibility values can be obtained where the other parameters of voxel identity, detector identity, and time of recording are known. The coefficients of the magnetic susceptibilities of the standards can be derived from the appropriate equations. And these coefficients can be used to determine the unknown magnetic susceptibility distribution of the body. The method of calibration in image reconstruction appears in U.S. Pat. Nos. 4,225,789 and 4,114,042.

Examples of equations used in reconstruction follow. Departures from the previously described derivation are noted. Furthermore, the calculations are made where the magnetic moment of the voxel is located at the origin in the center of the voxel, and the dipole moment vector is pointed in the positive Z direction and the detectors are oriented such that the planes are perpendicular to the axes indicated.

The vector potential for a magnetic dipole is $$A = \frac{m \times \hat{r}}{r^2}$$

where m is the magnetic dipole moment, $\hat{r}$ is a unit vector in the direction from the dipole to the point for which A is being computed. The magnitude of the vector potential at a point (x,y,z) is $$A = \frac{m \sin\theta}{r^2} = \frac{m\sqrt{x^2 + y^2}}{r^2}$$

The components of A are $$A_x = A\left(\frac{-y}{\sqrt{x^2 + y^2}}\right) = \frac{-my}{r^3}$$

$$A_y = A\left(\frac{x}{\sqrt{x^2 + y^2}}\right) = \frac{mx}{r^3}$$

$$A_z = 0$$

The vector potential of magnetic dipole moment rotated by angle $\theta$ about the X axis is $$\begin{bmatrix} A_x{}^1 \\ A_y{}^1 \\ A_z{}^1 \end{bmatrix} = \begin{bmatrix} 1 & 0 & 0 \\ 0 & \cos\theta & \sin\theta \\ 0 & -\sin\theta & \cos\theta \end{bmatrix} \begin{bmatrix} A_x \\ A_y \\ A_z \end{bmatrix}$$

The vector potential of magnetic dipole moment rotated by angle $\theta$ about the y axis is $$\begin{bmatrix} A_x{}^1 \\ A_y{}^1 \\ A_z{}^1 \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} A_x \\ A_y \\ A_z \end{bmatrix}$$

The vector potential of magnetic dipole moment rotated by angle $\theta$ about the z axis is $$\begin{bmatrix} A_x{}^1 \\ A_y{}^1 \\ A_z{}^1 \end{bmatrix} = \begin{bmatrix} \cos\theta & \sin\theta & 0 \\ -\sin\theta & \cos\theta & 0 \\ 0 & 0 & 1 \end{bmatrix} \begin{bmatrix} A_x \\ A_y \\ A_z \end{bmatrix}$$

The matrix for the combination of two rotations is given by the product matrix of the appropriate rotation matrices.

The components of the field, B, are found by finding the components of curl A.

$$B_x = (\nabla X A)_x = \frac{\delta A_z}{\delta y} - \frac{\delta A_y}{\delta z} =$$

$$\frac{-\delta}{z} \frac{mx}{(x^2+y^2+z^2)^{3/2}} = \frac{3mxz}{r^5}$$

$$B_y = (\nabla X A)_y = \frac{\delta A_x}{\delta z} - \frac{\delta A_z}{\delta x} =$$

$$\frac{\delta}{z} \frac{-my}{(x^2+y^2+z^2)^{3/2}} = \frac{3mxz}{r^5}$$

$$B_z = (\nabla X A)_z = \frac{\delta A_y}{\delta x} - \frac{\delta A_x}{\delta y} =$$

$$m\left[\frac{-2x^2+y^2+z^2}{(x^2+y^2+z^2)^{5/2}} + \frac{x^2-2y^2+z^2}{(x^2+y^2+z^2)^{5/2}}\right] = \frac{m(3z^2-r^2)}{r^5}$$

EXAMPLE FOR EMBODIMENT 1 AND 4

(cgs units, signals in volts for 500 loops; motion in the Z direction)

$\chi$ = paramagnetic susceptibility
$H(x,y,z)$ = applied field at x,y,z axes, where the vector orientation is along the z axis
a = area of voxel
A = area of detector
B = height of voxel The voltage signals in detectors perpendicular to x, y, and z are as follows:

$$V_x = \frac{\delta}{\delta t}(10^{-8})(500)\chi H_{(x,y,z)} aBA \frac{3xy}{(x^2+y^2+z^2)^{5/2}}$$

$$V_y = \frac{\delta}{\delta t}(10^{-8})(500)\chi H_{(x,y,z)} aBA \frac{3yz}{(x^2+y^2+z^2)^{5/2}}$$

$$V_z = \frac{\delta}{\delta t}(10^{-8})(500)\chi H_{(x,y,z)} aBA \frac{-2x^2+y^2+z^2}{(x^2+y^2+z^2)^{5/2}} +$$

$$\frac{x^2-2y^2+z^2}{(x^2+y^2+z^2)^{5/2}}$$

EXAMPLE FOR EMBODIMENTS 2 AND 5

(motion in the X direction)

The voltage signals in detectors perpendicular to x, y, and z are $$V_x = \frac{\delta}{\delta t}(10^{-8})(500)\chi H_{(x,y,z)} aBA \frac{3xy}{(x^2+y^2+z^2)^{5/2}}$$

$$V_y = \frac{\delta}{\delta t}(10^{-8})(500)\chi H_{(x,y,z)} aBA \frac{3yz}{(x^2+y^2+z^2)^{5/2}}$$

-continued $$V_z = \frac{\delta}{\delta t}(10^{-8})(500)\chi H_{(x,y,z)} aBA \frac{-2x^2+y^2+z^2}{(x^2+y^2+z^2)^{5/2}} +$$

$$\frac{x^2-2y^2+z^2}{(x^2+y^2+z^2)^{5/2}}$$

EXAMPLE OF EMBODIMENTS 3 AND 6, SHOWN IN FIG. 7.

($\theta$ changes as a function of time)

The transformation matrix from the x,y,z coordinate system to the $e_\gamma e_\theta$, $e_{100}$ spherical coordinate system is a follows:

$e_\epsilon = i\sin\theta\cos\phi + j\sin\theta\sin\phi + k\cos\theta$ $e_\theta = i\cos\theta\cos\phi + j\cos\theta\sin\phi - k\sin\theta$ $e_\phi = i\sin\phi + j\cos\phi$ The components of the field B relative to the spherical coordinate system may be found by performing the transformation on the components of the field B relative to the x,y,z coordinate system or the transformation operation may be performed on the components of the vector potential relative to x,y,z and then the components of the field B relative to the spherical coordinate system may be found by finding the components of curl A.

$$A = \frac{mx\hat{r}}{p^2} = \frac{m\sin\theta}{p^2}$$

components $x = p\sin\theta\cos\theta$ $y = p\sin\theta\sin\theta$ $z = p\cos\theta$ $$A_x = \frac{-my}{p^3}$$

$$A_y = \frac{mx}{p^3}$$

$$A_x = \frac{mp\sin\theta\sin\theta}{p^3}$$

$$A_y = \frac{mp\sin\theta\cos\theta}{p^3}$$

$$A_z = 0$$

$$A_{e\gamma} = \frac{m\sin^2\theta\sin\phi\cos\phi}{p^3} + \frac{m\sin^2\theta\sin\phi\cos\phi}{p^2} +$$

$$0 = \frac{2\sin^2\theta\sin\phi\cos\phi}{p^2}$$

$$A_{e\theta} = \frac{m\sin\theta\sin\phi\cos\theta\cos\phi}{p^2} = \frac{m\sin\theta\sin\phi\cos\theta\cos\phi}{p^2} -$$

$$0 = \frac{2m\sin\theta\cos\theta\sin\phi\cos\phi}{p^2}$$

$$A_{e\phi} = \frac{-m\sin\theta\sin^2\phi}{p^2} + \frac{m\sin\theta\cos^2\phi}{p^2} = \frac{m\sin\theta}{p^2}$$

$$B_{e\gamma} = (\nabla x A)_{e\gamma}$$

-continued $B_{e\theta} = (\nabla \times A)_{e\theta}$ $B_{e\phi} = (\nabla \times A)_{e\phi}$ $$\nabla = \frac{1}{h_1 h_2 h_3} \begin{vmatrix} h_1 e_1 & h_2 e_2 & h_3 e_3 \\ \delta/\delta_u & \delta/\delta_v & \delta/\delta_w \\ h_1 Q_1 & h_2 Q_2 & h_3 Q_3 \end{vmatrix}$$

$$\frac{1}{p^2 \sin\theta} \begin{vmatrix} e_p & pe_\theta & p\sin\theta e_\theta \\ \frac{\delta}{\delta p} & \frac{\delta}{\delta \theta} & \frac{\delta}{\delta \phi} \\ \frac{2m\sin^2\theta\sin\phi\cos\phi}{p^2} & \frac{2m\sin\theta\sin\phi\cos\theta\cos\phi}{p} & \frac{m\sin^2\theta}{p} \end{vmatrix}$$

$B_{e\gamma} =$ $$\frac{1}{p^2\sin\theta}\left[\frac{\delta}{\delta\theta} \frac{m\sin^2\theta}{p} - \frac{\delta}{\delta\phi} \frac{m2\sin\theta\sin\phi\cos\theta\cos\phi}{p}\right]$$

$$B_{e\theta} = \frac{1}{p\sin\theta}\left[\frac{\delta}{\delta\phi} \frac{2m\sin^2\theta\sin\phi\cos\phi}{p^2} - \frac{\delta}{\delta p} m\frac{\sin^2\theta}{p}\right]$$

$B_{e\phi} =$ $$\frac{1}{p}\left[\frac{\delta}{\delta p} \frac{2m\sin\theta\sin\phi\cos\theta\cos\phi}{p} - \frac{\delta}{\delta\theta} \frac{2m\sin^2\theta\sin\phi\cos\phi}{p^2}\right]$$

$$B_{ep} = \frac{m}{p^2\sin\theta}\left\{\frac{2\sin\theta\cos\theta}{p} - \frac{2\sin\theta\cos\theta}{p}[-\sin^2\phi + \cos^2\phi]\right\} =$$

$$\frac{4m\sin^2\theta\cos\theta}{p^3}$$

$$B_{e\theta} = \frac{m}{p\sin\theta}\left\{\frac{2\sin^2\theta}{p^2}(-\sin^2\phi + \cos^2\phi) + \frac{\sin^2\theta}{p^2}\right\} =$$

$$\frac{m}{p^3}\sin\theta(3\cos^2\theta - \sin^2\theta)$$

$$B_{e\phi} = \left\{\frac{-2\sin\theta\sin\phi\cos\theta\cos\phi}{p^2} - \frac{4\sin\phi\cos\phi\sin\theta\cos\theta}{p^2}\right\} =$$

$$\frac{-6m}{p^3}(\sin\phi\sin\theta\cos\phi\cos\theta)$$

The voltage signals in the detectors perpendicular to $e_\gamma$, $e_\theta$, $e_\phi$ are as follows:

$p = p_o(N - M\cos(wt + \theta_o))$;

$\theta = wt + \theta_o$ where $N$, $M$ $\theta_o$ are constants.

$$V_{e\gamma} = \frac{\delta}{\delta t}(10^{-8})(500)\chi H_{(x,y,z)} aBA4 \frac{\sin^2(wt+\theta_o)\cos(wt+\theta_o)e_\gamma}{[p_o(N - M\cos(wt+\theta_o))]^3}$$

$$V_{e\theta} = \frac{\delta}{\delta t}(10^{-8})(500)\chi H_{(x,y,z)} a \frac{BA\sin(wt+\theta_o)[3\cos^2(wt+\theta_o) - \sin^2(wt+\theta_o)]e_\theta}{[p_o(N - M\cos(wt-\theta_o))]^3}$$

$$V_{e\phi} = \frac{\delta}{\delta t}(10^{-8})(500)\chi H_{(x,y,z)} aBA(-6) \frac{\sin(wt+\theta_o)\sin\phi\cos\phi\cos(wt+\theta_o)e_\phi}{p_o(N - M\cos(wt+\theta_o))^3}$$

EXAMPLE FOR EMBODIMENTS 3 AND 6, SHOWN IN FIG. 8

($\phi$ changes as a function of time)

The transformation matrix from the x,y,z coordinate system to the $e_\gamma$, $e_\phi$, $e_z$ cylindrical coordinate system is as follows:

$e_R = i\cos\phi + j\sin\phi$ $e = -i\sin\phi + j\cos\phi$ $e_z = k$

The components of the field, B, relative to x,y,z are as follows:

$B_x = \frac{3mxz}{r^5}$ $B_y = \frac{3myz}{r^5}$ $B_z = \frac{m(3z^2 - r^2)}{r^5}$ components $r = (R^2 + z^2)^{\frac{1}{2}}$ $x = R\cos\phi$ $y = R\sin\phi$ $z = z$ $$\begin{bmatrix} B_{e\gamma} \\ B_{e\phi} \\ B_{ez} \end{bmatrix} = \begin{bmatrix} \cos\phi & \sin\phi & 0 \\ -\sin\phi & \cos\phi & 0 \\ 0 & 0 & 1 \end{bmatrix} \times \begin{bmatrix} \frac{3mzR\cos\phi}{(R^2+z^2)^{5/2}} \\ \frac{3mzR\sin\phi}{(R^2+z^2)^{5/2}} \\ \frac{m(3z^2 - (R^2+z^2))}{(R^2+z^2)^{5/2}} \end{bmatrix} =$$

$$B_{e\gamma} = \frac{3mzR\cos^2\phi + 3mZR\sin^2\phi}{(R^2+z^2)^{5/2}} = \frac{3mZR}{(R^2+z^2)^{5/2}}$$

$B_{e\phi} = 0$ $$B_{ez} = \frac{m(3z^2 - (R^2+z^2)^{\frac{1}{2}})}{(R^2+z^2)^{5/2}}$$

The voltage signals in the detectors perpendicular to $e_\gamma$, $e_\phi$, and $e_z$ are as follows:

$R = R_o(N - M\cos(wt+\phi_o))$; $= wt + \phi_o$ where $\phi_o$, $N$, and $M$ are constants.

$$V_e = \frac{\delta}{\delta t} (10^{-8})(500)\chi H_{(x,y,z)} a\, B\, A \frac{3zR_o\cos(wt + \phi_o)e_\gamma}{[(R_o(\cos wt + \phi_o))^2 + z^2]^{5/2}}$$

$$V_{e\phi} = 0$$

$$V_{ez} =$$

$$\frac{\delta}{\delta t}(10^{-8})(500)\chi H_{(x,y,z)} a\, B\, A \frac{3z^2 - [(R_o(\cos wt + \phi_o))^2 + z^2]^{\frac{1}{2}}}{((R_o(\cos wt + \phi_o))^2 + z^2)^{5/2}}$$

EXAMPLES OF EMBODIMENTS 3 and 6, SHOWN IN FIG. 9

(using cylindrical coordinates where the magnetic moment and H(x,y,z) are aligned along $\bar{R}$ The components of the vector potential, A, are as follows:

$$A = \frac{-my}{r^3}$$

$$A_y = \frac{mx}{r^3}$$

$$A_z = 0$$

The components of the vector potential relative to the x,y,z coordinate system after rotating the magnetic dipole moment to align with R are found by multiplying the vector potentials by the product matrix of, first, a rotation about the y axis of $\pi/2$, and then a rotation about the z axis of $\phi$.

$$\begin{bmatrix} A_x^1 \\ A_y^1 \\ A_z^1 \end{bmatrix} = \begin{bmatrix} \cos\phi & \sin\phi & 0 \\ -\sin\phi & \cos\phi & 0 \\ 0 & 0 & 1 \end{bmatrix} \begin{bmatrix} 0 & 0 & -1 \\ 0 & 1 & 0 \\ 1 & 0 & 0 \end{bmatrix} \times \begin{bmatrix} A_x \\ A_y \\ A_z \end{bmatrix}$$

$$\begin{bmatrix} A_x^1 \\ A_y^1 \\ A_z^1 \end{bmatrix} = \begin{bmatrix} 0 & \sin\phi & -\cos\phi \\ 0 & \cos\phi & \sin\phi \\ 1 & 0 & 0 \end{bmatrix} \times \begin{bmatrix} \frac{-my}{r^3} \\ \frac{mx}{r^3} \\ 0 \end{bmatrix}$$

$$A_x^1 = \frac{mx\sin\phi}{r^3} = \frac{mx\sin\phi}{(x^2+y^2+z^2)^{3/2}}$$

$$A_y^1 = \frac{mx\cos\phi}{r^3} = \frac{mx\cos\phi}{(x^2+y^2+z^2)^{3/2}}$$

$$A_z^1 = \frac{-my}{r^3} = \frac{-my}{(x^2+y^2+z^2)^{3/2}}$$

The components of the field, B, are found by finding the components of curl A.

$$B_x = \nabla \times A)_x = \frac{\delta A_z}{\delta y} - \frac{\delta A_y}{\delta z} =$$

$$-my(-3/2)(x^2+y^2+z^2)^{-5/2} 2y + (x^2+y^2+z^2)^{-3/2}(-m) -$$

$$mx\cos\phi(-3/2)(x^2+y^2+z^2)^{-5/2} 2z$$

$$B_y = (\nabla \times A)_y = \frac{\delta A_x}{\delta z} - \frac{\delta A_z}{\delta x} =$$

$$mx\sin\phi(-3/2)(x^2+y^2+z^2)^{-5/2} 2z +$$

$$my(-3/2)(x^2+y^2+z^2)^{-5/2} 2x$$

$$B_z = (\nabla \times A)_z = \frac{\delta A_y}{\delta x} - \frac{\delta A_x}{\delta y} =$$

$$mx\cos\phi(-3/2)(x^2+y^2+z^2)^{-5/2} 2x +$$

$$(x^2+y^2+z^2)^{-3/2} m\cos\phi -$$

$$mx\sin\phi(-3/2)(x^2+y^2+z^2)^{-5/2} 2x$$

The components of the field, B, relative to the cylindrical coordinate system, $e_\epsilon$, $e_\phi$, $e_z$, are found by performing a transformation on the coordinates relative to x,y,z. The components are:

$$x = R\cos\phi$$
$$y = r\sin\phi$$
$$z = Z$$

$$\begin{bmatrix} B_{e\gamma} \\ B_e \\ B_{ez} \end{bmatrix} = \begin{bmatrix} \cos\phi & \sin\phi & 0 \\ -\sin\phi & \cos\phi & 0 \\ 0 & 0 & 1 \end{bmatrix} \times$$

$$\begin{bmatrix} \frac{3mR^2\sin^2\phi}{(R^2+z^2)^{5/2}} - \frac{m}{(R^2+z^2)^{3/2}} + \frac{3mR\cos^2\phi Z}{(R^2+z^2)^{5/2}} \\ \frac{-3mZR\cos\phi\sin\phi}{(R^2+z^2)^{5/2}} - \frac{3mR^2\sin\phi\cos\phi}{(R^2+z^2)^{5/2}} \\ \frac{-3mR^2\cos^3\phi}{(R^2+z^2)^{5/2}} + \frac{mM\cos\phi}{(R^2+z^2)^{3/2}} + \frac{3mR^2\cos\phi\sin^2\phi}{(R^2+z^2)^{5/2}} \end{bmatrix}$$

$$B_{e\gamma} = \frac{3mR^2\sin^2\phi\cos\phi}{(R^2+z^2)^{5/2}} - \frac{m\cos\phi}{(R^2+z^2)^{5/2}} + \frac{3mR\cos^3\phi Z}{(R^2+z^2)^{5/2}} -$$

$$\frac{3mZR\cos\phi\sin^2\phi}{(R^2+z^2)^{5/2}} - \frac{3mR^2\sin^2\phi\cos\phi}{(R^2+z^2)^{5/2}}$$

$$B_{e\phi} = \frac{-3mR^2\sin^3\phi}{(R^2+z^2)^{5/2}} + \frac{\sin\phi m}{(R^2+z^2)^{3/2}} - \frac{3mZR\cos^2\phi\sin\phi}{(R^2+z^2)^{5/2}} -$$

$$\frac{3mzR\cos^2\phi\sin\phi}{(R^2+z^2)^{5/2}} - \frac{3mR^2\sin\phi\cos^2\phi}{(R^2+z^2)^{5/2}}$$

$$B_{ez} = \frac{-3mR^2\cos^3\phi}{(R^2+z^2)^{5/2}} + \frac{m\cos\phi}{(R^2+z^2)^{3/2}} + \frac{3mR^2\cos\phi\sin^2\phi}{(R^2+z^2)^{5/2}}$$

The voltage signals at detector perpendicular to $e_\gamma$, $e_\phi$, and $e_z$ are as follows:
$R = R_o(N - M\cos(wt+\phi_o)); = wt + \phi_o$ where M, N, and $\phi_o$ are constants.

$$V_{e\gamma} = \frac{\delta}{\delta t}(10^{-8})(500)\chi H_{(x,y,z)} a\, B\, A \frac{B_{e\gamma}}{m} e_\gamma$$

$$V_e = \frac{\delta}{\delta t}(10^{-8})(500)\chi H_{(x,y,z)} a\, B\, A \frac{B_{e\phi}}{m} e_\phi$$

$$V_{ez} = \frac{\delta}{\delta t}(10^{-8})(500)\chi H_{(x,y,z)} a\, B\, A \frac{B_{ez}}{m}$$

Modifications and substitutions of system elements and steps preceding the digitization and reconstruction by one skilled in the art is considered to be within the scope of the present invention, which is not to be limited except by the claims which follow.

APPENDIX I

PRINCIPLES AND APPLICATIONS OF PARAMAGNETIC DYNAMO ELECTROMOTIVE FORCE DETECTOR

This is a description of the simplified case to demonstrate the approximate strength of the signal generated in a coil by the flow of a paramagnetic substance into the space that was previously occupied by a diamagnetic substance.

This phenomenon is referred to as the paramagnetic dynamo electromotive force (PDE) and the method discussed in generating it and detecting it as the paramagnetic dynamo electromotive force detector (PDED) which consists of a diamagnetic object which is moved temporally through a space followed by a paramagnetic substance. This space is enclosed by a magnet and a current loop so that the magnet aligns the spin vectors of the molecules of the paramagentic substance so that more are aligned with the field than against as given by the Boltzman equation $N/N_o = e^{-\Delta E/KT}$, where $N_o$ is the aligned state, and thus the substance itself becomes magnetized, and since it is moving relative to the current loop, it gives rise to a potential difference around that loop by $E \cdot ds = d/dt B \cdot dA$. Also, since the strength of the magnetic field produced by the magnet is a function of the distance between it and the substance and this distance changes with time, and the population of molecules aligned with the field increases with the strength of the applied field, the magnetic flux also changes as a function of the distance which is a function of time. This contributes a positive term to the electromotive force generated in the current loop.

Approximation

I. First assume that the change in B with distance r is small and can be considered a constant. This will cause an underestimate in the result.

The ratio of the number of spin vectors in the aligned versus the unaligned state is given by the Boltzman equation $N/N_o = e^{-\Delta E/Kt}$ and $\Delta E$ is given by the product of the electron g factor which is 2 for an electron and the Bohr magneton and the field strength H and $\tau$ which is 1 for oxygen, for example.

$\Delta E = g\, BHJ$

The number of spin magnetic vectors aligned versus nonaligned is given by $$N_o - N = \frac{1 - e^{-\Delta E/KT}}{1 + e^{-\Delta E/KT}}$$

The magnetic moment of a magnetized piece of matter is given by $$M = C\hat{u}\frac{(1 - e^{-\Delta E/KT})}{1 + e^{-\Delta E/KT}}$$

where in this equation, C is the concentration in molecules per m$^3$, and $\hat{u}$ is given by $\hat{u} = g\, eh/4\, m_e c$ J = 2 times magnetic moment of an electron $2(9.3 \times 10^{-24} \text{J/T}) = 1.86 \times 10^{-23}$ J/T which is the colinear magnetic moment of a molecule of $O_2$ in this example.

II. Next assume we are dealing with a cylindrical piece of paramagnetic and diamagnetic matter, and that paramagnetic matter that is moving away from our PDED is sufficiently far enough away that it will not appreciably change the result; therefore it can be ignored. (In actuality, this will decrease the effect, but because in reality the applied field does decrease as a function of distance of distance and the magnetic field of magnetized matter (and therefore dB/dt) decrease with distance so that for the opposite end sufficiently far away at an instance of time, this will cause an insignificant change in the result.

To get the magnetic moment of the magnetized matter approaching the magnet and current loop, the cylinder is cut into disks, of area $\pi a^2$ and depth dr so $$m = \int m\, dv = u c \frac{(1 - e^{-\Delta E/KT})}{(1 + e^{-\Delta E/KT})} \pi a^2 dr$$

where a is the radius of the cylinder. Actually this is derived at b the integral $m = mdv = rmdrd\theta$.

The $B_z$ field due to the magnetic moment through the current loop and parallel to the long axis that parallel to r at a distance b from its center is given by $$B_z = \frac{\left[3\left(\frac{r^2}{r^2 + b^2}\right) - 1\right]m}{(r^2 + b^2)^{3/2}}$$

So if r is 0.01 m and the current loop has radius = 0.01 m, then $B_z$ ranges $B_z = 2m/r^3$ to $B_z = (m/2)/r^3$, only a 4× ratio. Assume the magnetic field B parallel to r at any point through the loop due to the magnetic moment of the magnetized matter is constant and equal to $m/r^3$. (This will have negligible effect on the result).

$$dB = \frac{\hat{u} c \pi a^2}{r^3} \frac{(1 - e^{-\Delta E/KT}) dr}{1 + e^{-\Delta E/KT}}$$

Next the equation $\int E \cdot ds = Nd/dt \int B \cdot da$ is examined. I will evaluate $\int B \cdot da$ for one disk since B was assumed to be constant, and B is parallel to r, this integral reduces to $$\int_0^{2\pi} \int_0^a B db\, d\theta\, dr = \frac{\hat{u} C (\pi a^3)^2}{r^3}\left(\frac{1 - e^{-\Delta E/KT}}{1 + e^{-\Delta E/KT}}\right) dr$$

This is the flux through the current ring due to one disk, and all these must be added up, which is just the integral from r=r to r=$\theta$, since by the assumptions and the derivative $$\frac{d}{dt}\left[(\text{constant})\int fr(t) dr\right] = \text{constant}\, fr(t)\frac{dr}{dt}$$

so we get the result $$\frac{V(t)}{N} = \frac{\hat{u} C (\pi a^2)^2}{r^3}\frac{1 - e^{-\Delta E/KT}}{1 + e^{-\Delta E/KT}}\frac{dr}{dt}$$

which is the voltage per loop generated in the coil which is described as one until now.

Now to determine this electromotive force. Just for example, use the numbers a=0.01 m which is the radius of the aortic valve $11a^2 = 3.14 \times 10^{-4} m^2$, which is the area of the aortic valve. The concentration of $Fe^2$ in blood is $9 \times 10^{-3}$m.

$$C = 9 \times 10^{-3}m = \frac{(9 \times 10^{-3}\text{mole})}{\text{liter}} \times$$

$$6.02 \times 10^{23} \frac{\text{molecules}}{\text{mole}} \cdot \frac{1 \text{ liter}}{1000^{cc}} \times \frac{10^6 cc}{1m^3}$$

$$C_{O2} = 5.4 \times 10^{24} \frac{\text{molecules}}{m^3}$$

$$H = .2T$$

$$\Delta E = (2)(9.3 \times 10^{-24} J/T)(.2T) = 8.7 \times 10^{-4}$$

$$\frac{1 - e^{-\Delta E/KT}}{1 + e^{-\Delta E/KT}} = 4.35 \times 10^{-4}$$

$$\frac{dr}{dt} \text{ max for aorta} = .2 \text{ m/sec}$$

$$V/N =$$

$$\frac{(2)9.3 \times 10^{-24} J/T}{(.01)^3} (\pi(.01)^2)^2 (4.35 \times 10^{-4}) \cdot 2m/sec \cdot \frac{5.4 \times 10^{24}}{m^3}$$

$$V/N = 8.6 \times 10^{-4} \quad V = \frac{862 \mu V}{\text{loop}}$$

A coil of 100 loops would generate 86.2 millivolts. This is a very detectable voltage. If one wire is grounded to the body, and the other run through the chambers of the heart to exit out a vein, in the same manner as is the case with present pace makers, and to the surface of the chest, then voltage changes as a function of time can be recorded and correlated with pathology by a microcomputer, which would also have available to it the information, heart rate which can be obtained by strapping a pressure transducer around a limb with a Velcro strip and interfacing it with the microprocessor. From the time rise and fall of current, pressures can be determined and the shape of pressure waves will reveal pathology; also, since $O_2$ is being monitored, via deoxy Hb saturation peripheral oxygenation, cardiac, and pulmonary function are being monitored.

Stringent treatment which takes into count all variables except it assumes H is not a function of the distance perpendicular to the central axis and since the radius is small this is a good approximation.

Angiography with PDEDs

Electrons have a short but finite relaxation time. Angiography can be implemented by using multiple PDEDs recording from different spatial orientations.

The field is increased as the PDEDs approach the body very rapidly, or the same effect can be produced by electromagnets. Furthermore, the faster the field is brought up, the greater the magnitude of the voltage seen in the recording coil (dr/dt term in PDED equation) within limits of time of achieving the Boltzman distribution. Also, because the relaxation time is finite and within the range of times over which the B field is brought up to a maximum of the body surface, velocity of blood flow can be determined from transient phase relationships between different spatially related PDEDs due to the effect of previous relative motion of the blood between the different PDEDs during the change of the B field and when the change in field is stopped at the maximum.

$O_2$ Tension with PDEDS

Neonates supported by ventilation are at risk of hypoxia, which causes brain damage or excessive $O_2$ tension which causes blindness. Blood has a paramagnetic component which is a function of the $O_2$ tension, and this penomenon can be detected with a PDED. A peripheral artery can be catheterized where this catheter is special in that it contains a ball valve and a PDED. The signal from the PDED will be interfaced with a microprocessor that also controls the rate of the ventilator. Also, a PDED could be placed around a limb; blood is periodically squeezed out of a vessel; reflow is restored, and a signal recorded by a PDED which is used in controlling ventilation rise. Also, signal change with perturbation, AV difference in signals.

What is claimed is:

1. An imaging system for producing images of an object, comprising:
   means for generating a first magnetic field producing a flux path positioned to substantially include said object having a paramagnetic substance in said magnetic flux path, causing said paramagnetic substance to produce a second magnetic field therefrom in response to said first magnetic field;
   means for receiving said paramagnetic substance induced second magnetic field and producing a plurality of detector signals therefrom;
   means for moving both said means for generating and said means for receiving in concert relative to said object;
   an array processor means for receiving said detector signals and selectively producing display signals therefrom; and
   display signals means for receiving said display and producing a man-readable representation therefrom, wherein
   said first magnetic field includes a substantially constant magnetic field component.

2. A system for imaging tissue having a plurality of regions of selective magnetic susceptibility, comprising:
   means for energizing said areas of selective magnetic susceptibility to produce a varying magnetic field, wherein said magnetic field is variable according to said areas of selective magnetic susceptibility;
   a plurality of sensors arranged to define an area described by two coordinates and located in proximity to said tissue, wherein each sensor receives at least a portion of said varying magnetic fields of said areas of selective magnetic susceptibility and producing a sensor signal corresponding thereto; and
   means to reconstruct a model of magnetic susceptibility of the regions of said tissue wherein structural information of said tissue is related to said model of magnetic susceptibility.

3. The system of claim 2, wherein
   said means for energizing comprises a means to generate a first magnetic field, wherein said regions of selective magnetic susceptibility provides a radiated second magnetic field in response to said first magnetic field, said second magnetic field being received by said plurality of sensors.

4. The system of claim 3, wherein
   said regions of selective magnetic susceptibility include regions of paramagnetic material.

5. The system of claim 2, further including means to move said means for energizing and said plurality of sensors in concert through a region including said tissue.

6. The system of claim 2, wherein
each said plurality of sensors comprises a plurality of magnetic sensors arranged to detect magnetic fields in orthogonal relationships.

7. A method of imaging the paramagnetic constituents of a body in three dimensions comprising the steps of:
providing a first magnetic field through said body;
radiating a second magnetic field from said body in response to said first magnetic field and the paramagnetic properties of the constituents of said body;
detecting said second, magnetic field by a plurality of detectors to produce a plurality of detector signals therefrom, said second magnetic field being paramagnetically induced;
processing said plurality of detector signals to produce an image signal therefrom; and
providing a representation of said paramagnetic constituents according to said image signal.

8. The method of claim 7, further including the step of
moving said first magnetic field and said plurality of detectors simultaneously to cause cancellation of the effects of said first magnetic field at said plurality of detectors.

9. An imaging system for producing images of an object, comprising:
means for generating a first magnetic field comprising a varying magnetic field, producing a flux path positioned to substantially include said object having a paramagnetic substance in said magnetic flux path, causing said paramagnetic substance to produce a second magnetic field therefrom in response to said first magnetic field;
means for receiving said paramagnetic substance induced second magnetic field and producing a plurality of detector signals therefrom;
means for moving both said means for generating and said means for receiving in concert relative to said object;
an array processor means for receiving said detector signals and selectively producing display signals therefrom; and
display means for receiving said display signals and producing a man-readable representation therefrom, wherein
said second magnetic field includes components at the frequency of said varying first magnetic field, and
said array processor means provides said display signals according to said paramagnetic substance induced second magnetic field components, those components occurring at the frequency of said varying first magnetic field.

* * * * *

UNITED STATES PATENT AND TRADEMARK OFFICE
CERTIFICATE OF CORRECTION

PATENT NO. : 4,969,469

DATED : Nov. 13, 1990

INVENTOR(S) : Randell L. Mills

It is certified that error appears in the above-identified patent and that said Letters Patent is hereby corrected as shown below:

Col. 28, line 36, after "display" (first occurrence) delete ---signals---.

Col. 28, line 36, after "display" (second occurrence) insert ---signals---.

Signed and Sealed this

Fourth Day of August, 1992

Attest:

DOUGLAS B. COMER

Attesting Officer

Acting Commissioner of Patents and Trademarks